United States Patent
Aromin et al.

(10) Patent No.: US 11,329,476 B1
(45) Date of Patent: May 10, 2022

(54) TESTGUARD CIRCUIT WITH AUTO MONITORING AND END-OF-LIFE CIRCUITRY

(71) Applicants: Victor V. Aromin, West Warwick, RI (US); Louis J. Shatkin, Warwick, RI (US)

(72) Inventors: Victor V. Aromin, West Warwick, RI (US); Louis J. Shatkin, Warwick, RI (US)

( * ) Notice: Subject to any disclaimer, the term of this patent is extended or adjusted under 35 U.S.C. 154(b) by 0 days.

(21) Appl. No.: 17/316,767

(22) Filed: May 11, 2021

(51) Int. Cl.
*H02H 3/16* (2006.01)
*G01R 31/52* (2020.01)
*H02H 3/05* (2006.01)
*H02H 1/00* (2006.01)

(52) U.S. Cl.
CPC ............... *H02H 3/16* (2013.01); *G01R 31/52* (2020.01); *H02H 1/0007* (2013.01); *H02H 3/05* (2013.01)

(58) Field of Classification Search
CPC ........ G01R 31/52; G01R 31/58; H01H 75/00; H01H 83/02; H02H 1/0007; H02H 3/00; H02H 3/05; H02H 3/08; H02H 3/16; H02H 3/335
See application file for complete search history.

(56) References Cited

U.S. PATENT DOCUMENTS

| | | | |
|---|---|---|---|
| 4,578,732 A * | 3/1986 | Draper | H01H 83/04 335/18 |
| 4,816,957 A * | 3/1989 | Irwin | H02H 3/33 335/18 |
| 4,918,977 A | 4/1990 | Takahaski et al. | |
| 5,173,673 A * | 12/1992 | Weigand | H01H 83/02 361/42 |
| 5,177,657 A * | 1/1993 | Baer | H02H 3/331 361/114 |
| 5,418,678 A * | 5/1995 | McDonald | H01H 83/02 335/19 |
| 5,517,165 A | 5/1996 | Cook | |
| 5,757,598 A * | 5/1998 | Aromin | H01H 47/04 361/42 |
| 6,052,266 A * | 4/2000 | Aromin | H01H 47/04 361/42 |
| 6,144,209 A | 12/2000 | Raymond et al. | |
| 6,218,647 B1 | 4/2001 | Jones | |
| 7,307,211 B1 | 12/2007 | Caccia | |
| 7,492,558 B2 | 2/2009 | Germain et al. | |
| 8,384,502 B2 | 2/2013 | Gao | |
| 8,587,914 B2 | 11/2013 | Kamor et al. | |
| 8,659,857 B2 | 2/2014 | Gandolfi | |

(Continued)

*Primary Examiner* — Jared Fureman
*Assistant Examiner* — Nicolas Bellido

(57) ABSTRACT

A manually switched Testguard circuit with auto-monitoring and end-of-life circuitry is provided. The manually switched Testguard circuit interrupts the flow of current through a pair of lines, wherein one of the pair of lines extends between a line input and a line output and the other line extends between a neutral input and a neutral output. The manually switched Testguard circuit includes a monitoring module for detecting an end-of-life condition. The monitoring module includes a simulated ground fault generator for simulating a ground fault; an auto-monitoring logic module; a relay synchronized switch; and an end-of-life switch for disabling the manually switched Testguard circuit if certain Testguard component failures are detected.

13 Claims, 2 Drawing Sheets

(56) References Cited

U.S. PATENT DOCUMENTS

| | | |
|---|---|---|
| 8,760,824 B2 | 6/2014 | Armstrong |
| 9,312,680 B2 | 4/2016 | Li et al. |
| 9,450,395 B2 | 9/2016 | Aromin et al. |
| 9,478,382 B1 | 10/2016 | Aromin |
| 9,608,433 B2 | 3/2017 | Simonin |
| 9,966,165 B2 | 5/2018 | Gross et al. |
| 10,001,526 B2 | 6/2018 | Salas |
| 10,020,649 B2 | 7/2018 | Du |
| 10,877,105 B1 * | 12/2020 | Aromin ............... G01R 31/52 |
| 2005/0243485 A1 | 11/2005 | Gershen et al. |
| 2007/0030608 A1 * | 2/2007 | Baldwin ............... H01H 83/04 |
| | | 361/42 |
| 2008/0024945 A1 * | 1/2008 | Gao ............... H01H 83/04 |
| | | 361/42 |
| 2011/0209894 A1 | 9/2011 | Williams et al. |
| 2014/0098446 A1 * | 4/2014 | Aromin ............... H02H 3/16 |
| | | 361/42 |
| 2016/0365718 A1 * | 12/2016 | Legatti ............... H02H 3/08 |
| 2016/0380424 A1 * | 12/2016 | Aromin ............... H01H 9/0228 |
| | | 361/50 |
| 2018/0017611 A1 | 1/2018 | Radun et al. |
| 2018/0337530 A1 | 11/2018 | Gariboldi et al. |
| 2019/0341766 A1 * | 11/2019 | Aromin ............... H01H 13/14 |

\* cited by examiner

TESTGUARD CIRCUIT WITH AUTO MONITORING AND END-OF-LIFE CIRCUITRY

1. FIELD OF USE

The present invention relates generally to electrical safety devices and more particularly to a manual reset Testguard circuit with auto monitoring and end-of-life circuitry.

2. DESCRIPTION OF PRIOR ART (BACKGROUND)

Conventional electrical appliances typically receive alternating current (AC) power from a power supply, such as an electrical outlet, through a pair of conducting lines. The pair of conducting lines, often referred to as the line and neutral conductors, enable the electrical appliance, or load, to receive the current necessary to operate.

The connection of an electrical appliance to a power supply by a pair of conducting lines creates a number of potentially dangerous conditions. In particular, there exists the risk of ground fault, leakage currents and grounded neutral conditions in the conducting lines. When a ground fault or leakage current condition occurs it creates an imbalance between the currents flowing in the line and neutral conductors. A grounded neutral condition occurs when the neutral conductor is grounded at the load. A ground fault condition is extremely dangerous and can result in serious injury.

Ground fault and leakage current interrupters include circuit breakers, receptacles, portable and cord mounted protection devices. They may be troubled by false tripping, even though they pass all present industry standards. One cause of false tripping is disconnection of the power to inductive appliances, particularly by unplugging the appliances.

Examples of these appliances include electric shavers, high intensity lamps, and small cooling fans, such as are used for cooling electronic equipment. Unplugging these appliances generates an arc between the plug and the receptacle, resulting in the superimposition of several volts of wide band noise onto the power line. Due to the wide band nature of the noise, even a very small stray coupling capacitance will couple the noise from the power line conductor into the ground fault circuit, causing a false trip.

Grounded neutral detection is provided by a dormant oscillator circuit configuration. The detector circuit includes first and second sensor coils through which the line and neutral conductors of the protected circuit pass. If a load side grounded neutral condition occurs, both cores sensor coils are coupled together to create an oscillating signal that is applied through a coupling capacitor to the above-described operational amplifier followed by a window comparator, this action generates a trip signal.

It has been found that wide band noise induced by load related switching phenomena such as is caused by unplugging inductive appliances causes false tripping of the ground fault interrupter.

Ground fault circuit and leakage current interrupters are well known in the art and are commonly used to protect against ground fault, leakage currents and grounded neutral conditions. In general, GFCI devices sense the presence of ground fault and grounded neutral conditions in the conducting lines and in response thereto, open at least one of the conducting lines between the power supply and the load to eliminate the dangerous condition.

In U.S. Pat. No. 5,177,657, to M. Baer et al, there is disclosed a ground fault interrupter circuit which interrupts the flow of current to a pair of lines extending between a source of power and a load. The ground fault interrupter circuit includes a circuit breaker comprising a normally open switch located in one or both of the lines, a relay circuit for selectively closing the normally open switch, an electronic latch circuit operable in first and second bi-stable states and a fault sensing circuit for sensing the presence of a fault condition in at least one of the lines. The electronic latch circuit causes the relay circuit to close the normally open switch and maintain the normally open switch in its closed position when the electronic latch circuit is in the first bi-stable state. The electronic latch circuit also causes the relay circuit to permit the normally open switch to return to its normally open condition when the latch circuit is in its second bi-stable state. A fault sensing circuit senses the presence of a fault condition in at least one of the lines and causes the electronic latch to latch in its second state upon detection of the fault condition.

In U.S. Pat. No. 5,418,678 to T. M. McDonald, there is disclosed an improved ground fault circuit interrupter (GFCI) device which requires manual setting following initial connection to an AC power source or termination of a power source interruption. The improved GFCI device utilizes a controlled switching device which is responsive to a load power signal for allowing the relay contact sets of the GFCI device to be closed only when power is being made available at the output or load terminals. The controlled switching device preferably comprises an opto-isolator or other type of switching device which provides isolation between the GFCI input and output terminals when the relay contact sets are open. The improved GFCI device may be incorporated into portable units, such as plug-in or line cord units, for use with unprotected AC receptacles.

In U.S. Pat. No. 4,816,957 to L. F. Irwin there is disclosed an adapter unit comprising a moisture resistant housing within which is carried an improved, self-testing ground line fault interrupter device. The improved device is electrically interconnected with a connector carried externally of the adapter housing so that the unit can be plugged directly into a standard duplex outlet of an existing circuit. The apparatus includes circuitry that automatically tests the operability of the device when it is plugged into a duplex outlet without the need for manual manipulation of test buttons or other overt action by the user.

In U.S. Pat. No. 4,578,732 to C. W. Draper et al there is disclosed a wall socket type ground fault circuit interrupter having a pair of sockets, a reset button and a test button that are accessible from the front of the interrupter. The interrupter has latched snap-acting contacts and a novel latching relay structure for maintaining the snap-acting contacts in a circuit making position. The snap-acting contacts permit all of the components including the monitoring toroids (sensing transformers) and the power supply to be respectively located and connected at the load side of the snap-acting contacts so that all of the circuits of the interrupter are de-energized when the contacts snap to a circuit opening position. The snap-acting contact mechanism and relay are provided with structures which provide the interrupter with a trip-free mode of contact actuation and accordingly a tease-proof snap-acting contact operation.

One drawback of GFCI devices of the type described above is that the GFCI device generally includes a large solenoid to selectively open and close the switching device. Specifically, the solenoid generally requires a constant supply of line voltage (approximately 120 volts) in order to switch and sustain the solenoid in its energized state. As a consequence, the solenoid acts as a large power drain source.

UL943 now requires all GFCIs to indicate "end of life" if the device fails to trip when the test button is manually operated. However, even if end-users regularly tested their devices, a GFCI device that did not test properly could nevertheless be reset, and continue to provide power, without providing ground-fault protection. Without a built-in power denial feature, a consumer could erroneously and tragically assume that if power is available, so is protection. Many end users were (and continue to remain) unaware of the need for regular testing, despite manufacturers' warnings; and others, who were aware, were not always conscientious in performing the testing. The latest edition of UL943 has introduced requirements for all GFCI's to include "auto monitoring" (AM) and "end of life" (EOL), whereby the GFCI will test itself at regular intervals (AM), in the case of a GFCI circuit failure provide a user indication and remove itself from service (EOL).

Auto monitoring (AM), end-of-life (EOL) typical events are the ground fault sensing components (toroids and integrated circuit) are open or short circuited; the trip solenoid and/or its control circuit is faulty, or the switching semiconductor (SCR) controlling the trip solenoid control circuit is open or short circuited.

Thus, there is a need for a solenoid of sufficient rating for use in a line voltage GFCI device but with reduced tendency to fail due to high voltages and currents associated with typical line voltages. There is also a need for a ground fault interrupter which does not generate a false trip in response to wide band noise in the protected circuit. There is also a need for such a ground fault circuit with improved immunity to wide band noise which also responds to sputtering arc faults.

There is also a need for a manual reset Testguard circuit with manual and automatic testing of the often-failed components of a GFCI and denial of power if testing fails.

SUMMARY OF THE INVENTION

A manually switched test guard circuit for interrupting the flow of current through a pair of power lines connected between a load and power source is provided. The circuit includes a ground fault circuit interrupter (GFCI) having a pair of ganged manually switched first and second switches disposed between the load and power source. Each of the manual switches comprises a connected position for connecting the load and power source and a disconnected position for interrupting, or disconnecting the load from the power source. A relay circuit having a solenoid controls the first and second manual switches. The test guard circuit includes a fault detection circuit for detecting a ground fault in the pair of lines and a bi-stable electronic latch circuit for deenergizing the relay circuit if a fault is detected. The test guard circuit also includes a monitoring module integrated with the GFCI. The monitoring module includes a simulated ground fault generator for generating a ground fault on-pulse for testing the fault detection circuit and the first bi-stable electronic latch circuit. The monitoring module also includes a relay synchronized switch for disabling current to the relay circuit during the ground fault on-pulse; an auto-monitoring logic module for monitoring the first bi-stable electronic latch circuit during the ground fault on-pulse; an end-of-life switch for deenergizing the relay circuit and switching each of the manual switches to the disconnected position if the auto-monitoring logic module determines the first bi-stable electronic latch circuit has failed. The test guard circuit also includes a power supply circuit for providing current to the relay synchronized switch, and the relay synchronized switch provides current to the fault detection circuit via the solenoid and wherein the current maintains the manually switched switches in the connected position if a ground fault is not detected. The solenoid includes a magnetic field when energized by the current provided by the relay synchronized switch and a collapsing magnetic field when the current is interrupted by the relay synchronized switch during the ground fault on-pulse. The collapsing magnetic field provides current through the solenoid to maintain the manual switches in the connected position during the ground fault on-pulse. The collapsing magnetic field provides current to the GFCI IC during the ground fault on-pulse.

The invention is also directed towards a method for intermittently testing components of a ground fault circuit interrupter (GFCI) for interrupting power between a line input and a line output. The method includes providing a simulated ground fault generator for generating a ground fault test on-pulse; providing a relay for disconnecting manual switches for interrupting power between the line input and the line output when the relay is deenergized. The method also includes providing a relay synchronized switch for interrupting current to the relay for the duration of the ground fault test on-pulse. The method includes switching on a bi-stable electronic latch circuit during the ground fault test on-pulse; and providing a monitoring circuit for detecting switch-on failure of the bi-stable electronic latch circuit during the ground fault test on-pulse. The method also includes maintaining the relay in an energized state and the manual switches in the connected position for the duration of the ground fault test on pulse.

Additional objects, as well as features and advantages, of the present invention will be set forth in part in the description which follows, and in part will be obvious from the description or may be learned by practice of the invention. In the description, reference is made to the accompanying drawings which form a part thereof and in which is shown by way of illustration specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate various embodiments of the invention and, together with the description, serve to explain the principles of the invention. In the drawings wherein like reference numerals represent like parts.

DETAILED DESCRIPTION

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Figure 1:
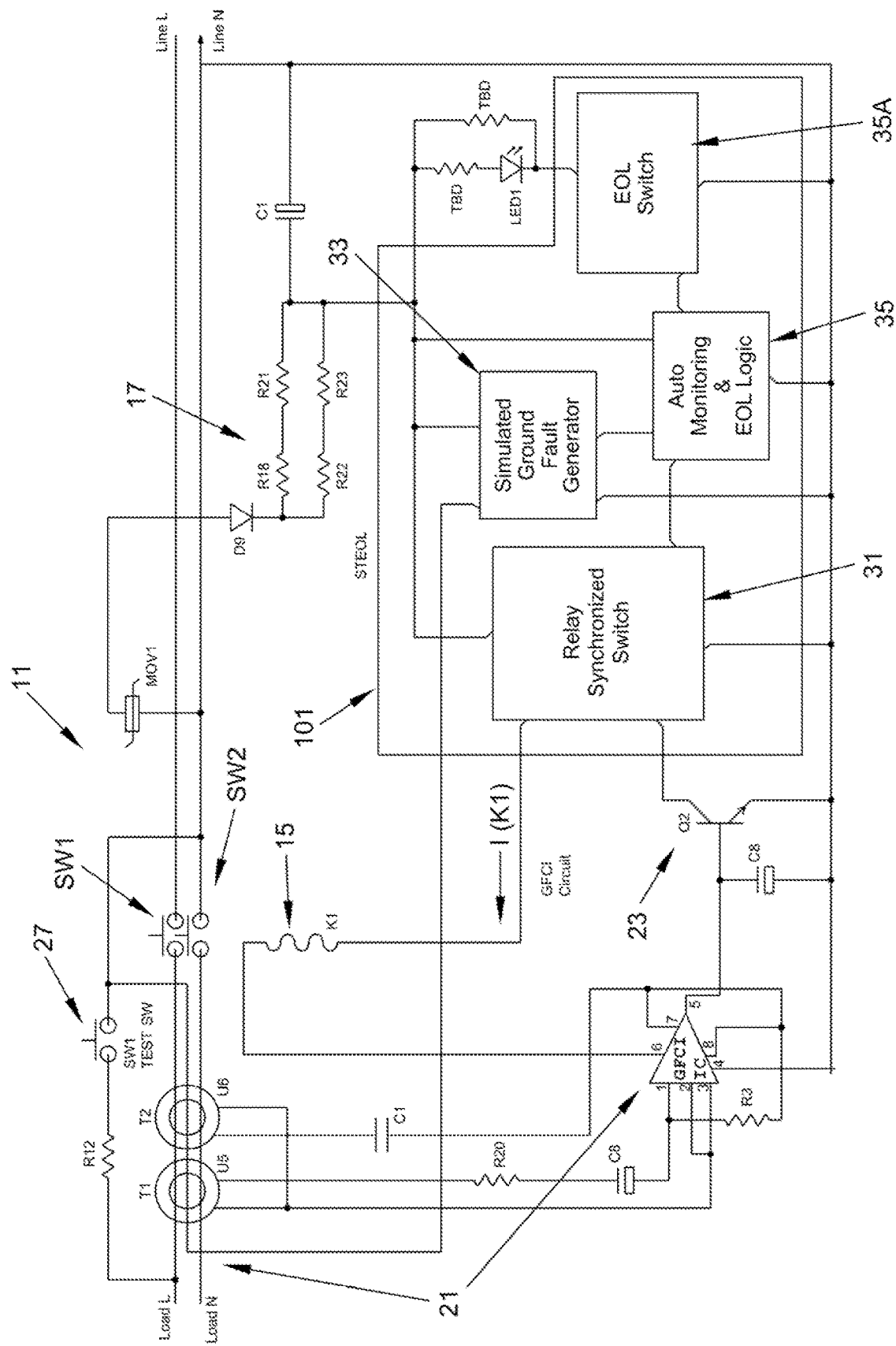
FIG. 1 is a schematic circuit diagram of a manual reset ground fault circuit interrupter (GFCI) with monitoring features of the present invention.
Figure 2:
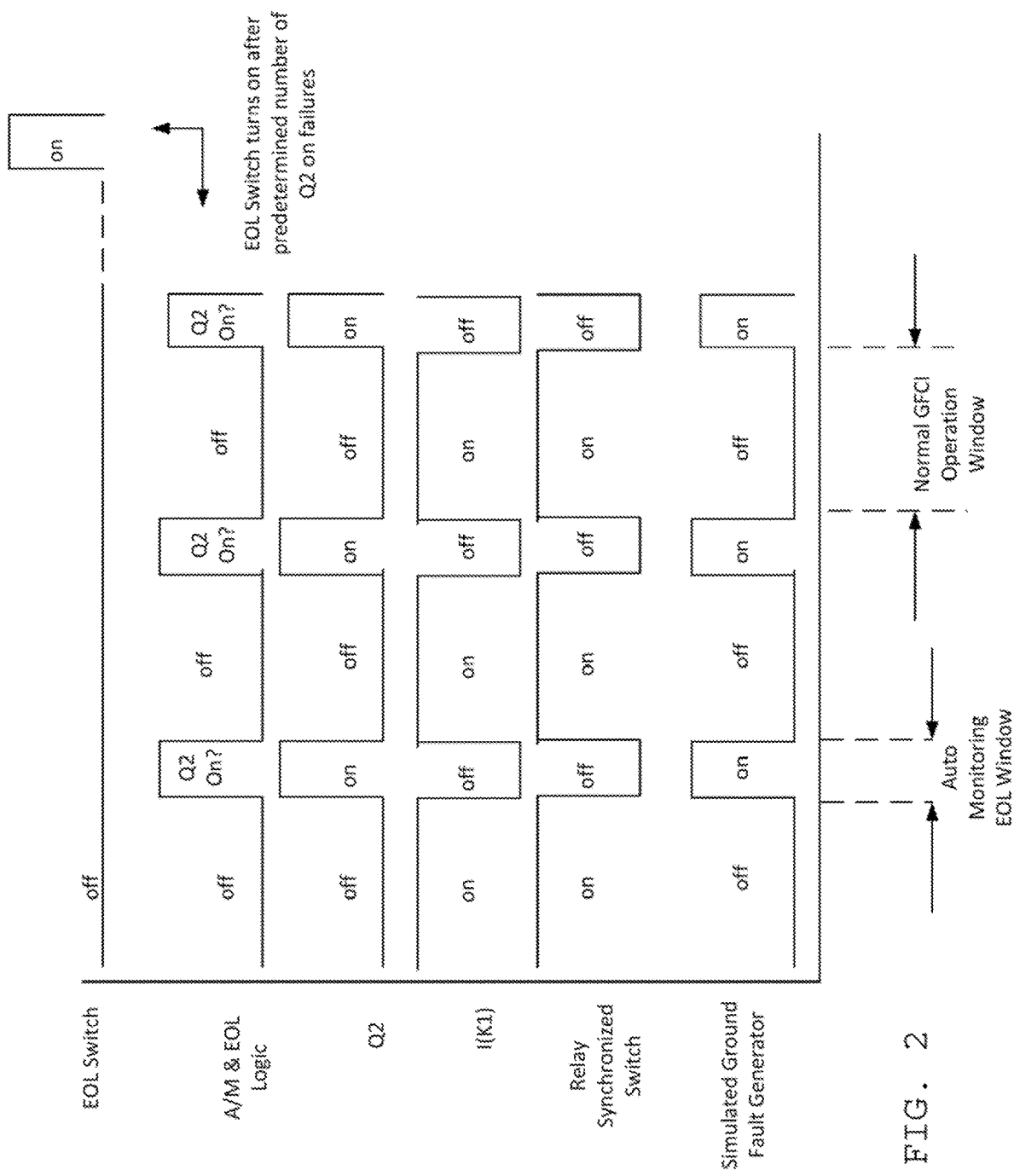
FIG. 2 is a timing relationship diagram of the monitoring features shown in FIG. 1.

Referring now to FIG. 1 and FIG. 2, there is shown a manual reset Testguard circuit including ground fault circuit interrupter (hereinafter GFCI) circuit constructed and operated according to the teachings of the present invention during the normal GFCI operation window shown in FIG. 2. The end of life (herein after monitoring) module is constructed and operated according to the teachings of the present invention during the Auto Monitoring EOL Window shown in FIG. 2.

As will be discussed in detail below, the GFCI automatically protects a load from ground fault conditions upon the initial connection of Input L to Load L and Input N to Load N. Furthermore, once GFCI protects the load from a ground fault condition, GFCI 11 can be reset to protect against further ground fault conditions.

GFCI circuit shown in FIG. 1 includes components arranged as shown and discussed herein. The GFCI circuit includes ganged switches SW1 and SW2, a relay circuit 15, a power supply circuit 17, a fault detection circuit 21 for detecting an electrical fault, a bi-stable electronic latch circuit 23, and a test circuit 27. Also shown in FIG. 1 is a monitoring circuit 101. The monitoring circuit includes a relay synchronized switch 31, a simulated ground fault generator 33, an end of life logic circuit 35, and End of Life Switch 35A.

Switches SW1 and SW2 are located in the line and neutral conductive lines, respectively, between a power source and a load. Switches SW1 and SW2 can be positioned in either of two connective positions. In the first connective position, which is illustrated in FIG. 1, switches SW1 and SW2 are positioned such that the input power source is connected to the load. In the second connective position, which is the opposite position illustrated in FIG. 1, switches SW1 and SW2 are positioned such that the input power source is disconnected from the load.

Relay circuit 15 acts to selectively position switches SW1 and SW2 in either its first connective position or its second connective position. Relay circuit 15 comprises a solenoid K1.

Solenoid K1 is ganged to the circuit breaker contacts of switches SW1 and SW2 and is responsible for selectively controlling the connective position of switches SW1 and SW2. Before power is applied to GFCI 11, solenoid K1 15 position switches SW1 and Sw2 are in the opposite connective position as shown. When current I(K1) is supplied to solenoid K1 via power supply circuit 17 via Relay Synchronized Switch 31 there is insufficient current to latch switches SW1 and SW2, thus requiring manual latching. There is sufficient current I(k1) through solenoid K1 15 to maintain switches SW1 and SW2 in a latched connective position.

Power supply circuit 17 provides power for the GFCI circuit. Power supply circuit 17 comprises rectifier diode D9, voltage dropping resistors R18, R21, R22, and R23, and capacitor C3. Also shown in FIG. 1, is Varistor MOV1 which has a value of 150 volts and acts to protect against a voltage surge from the AC power source.

Fault detection circuit 21 detects both ground fault and grounded neutral conditions in the conductive lines when switches SW1 and SW2 are in their second connective position. Fault detection circuit 21 comprises a sense transformer T1, a grounded neutral transformer T2, a coupling capacitor C8, a noise suppression capacitor C1, a feedback resistor R3, and a ground fault interrupter integrated circuit GFCI IC.

Sense transformer T1 senses an electrical fault such as the current differential between the line and neutral conductive lines and upon the presence of a ground fault condition, transformer T1 induces an associated output from its secondary windings. Grounded neutral transformer T2 acts in conjunction with transformer T1 to sense the presence of grounded neutral conditions and, in turn, induce an associated output. Coupling capacitor C8 couples the AC signal from the secondary winding of transformer T1 to GFCI IC. Capacitor C1 prevents fault detection circuit 21 from operating in response to line disturbances such as electrical noise and lower level faults.

Together capacitor C8 and resistor R3 set the minimum fault current at which fault detection circuit 21 provides an output signal to latch circuit 23. GFCI IC amplifies a fault signal generated by transformer T1 and generates an output pulse on pin 5 to activate latch circuit 23.

Upon detection of a ground fault or grounded neutral condition GFCI IC generates an output pulse on pin 5 to activate latch circuit 23 (e.g., Q2 turns "on" during the "off" period during normal GFCI operation shown in FIG. 2. Activated Latch Circuit 23 deactivates or de-energizes solenoid K1 15 via Relay Synchronized Switch 31 by removing energizing current I(K1). Latch circuit 23 comprises NPN transistor Q2, and a noise suppression capacitor C2. Noise suppression capacitor C2 prevents transistor Q2, when in its nonconductive state, from firing as a result of electrical noise. It will be appreciated from FIG. 2 that if the Testguard Circuit 11 detects a ground fault or grounded neutral condition during the auto monitoring window Q2 will not transition back to the off state, i.e., will stay on longer than the Auto monitoring EOL window, thus deenergizing K1 15

Test circuit 27 provides a means of testing whether the GFCI circuit is functioning properly. Test circuit 27 comprises a test switch of conventional push-in type design. When the test switch is depressed to energize test circuit 27, resistor R12 provides a simulated fault current to transformer T1 which is similar to a ground fault condition.

Auto Monitoring and End of Life

The monitoring module 101 includes a relay synchronized switch 31, a simulated ground fault generator 33, an auto monitoring and end of life circuit 35, and End of Life Switch 35A.

Simulated ground fault generator (SGFG) 33 includes the logic and means necessary to simulate a periodic ground fault. See FIG. 2. During normal GFCI operation the SGFG 33 is off. During the auto monitoring window SGFG generates a short on pulse setting the base timing of the auto monitoring end of life (EOL) window. The SGFG pulse is sensed by GFCI circuit 21 as a ground fault. Upon detection of the simulated ground fault GFCI IC generates an output pulse on pin 5 to activate latch circuit 23 (Q2)

The SGFG pulse is also sensed by GFCI Relay Synchronized Switch 31 which includes the logic and means necessary to temporarily turn off the normal GFCI fault detection described above when the SGFG 33 generates the short on pulse for the purpose of auto monitoring the ground fault detection circuit. The tested GFCI components include the sense transformer T1, the grounded transformer T2, the GFCI IC and the bi-stable electronic latch circuit 23. It will be appreciated that current I(K1) through solenoid K1 15 is the power source for GFCI IC in GFCI circuitry 21. It will be further appreciated that the timing window, or pulse period, set by SGFG is of short enough duration so when K1 15 is temporarily turned off during the auto monitoring EOL window the collapsing K1 15 magnetic field maintains sufficient current flow through K1 15 to maintain switches SW1 and SW2 in their connective positions. It will be further appreciated that the collapsing K1 15 magnetic field maintains sufficient power to the GFCI IC for the duration of the auto monitoring EOL window.

The auto-monitoring and EOL logic (monitoring) circuit 35 determines the number of times Q2 does not turn on during successive auto monitoring EOL windows. As shown in FIG. 2, if test question Q2 ON? is off then Q2 has failed to turn on. If Q2 fails to turn on for a predetermined number of times the GFCI fault detection circuitry is defective and the EOL switch 35A is activated, thus deenergizing solenoid K1.

The versions of the present invention described above are intended to be merely exemplary and those skilled in the art shall be able to make numerous variations and modifications to it without departing from the spirit of the present invention. All such variations and modifications are intended to be within the scope of the present invention as defined in the appended claims. For example, it should be noted that the particular components which make up the aforementioned embodiments may be interchanged or combined to form additional embodiments.

What is claimed is:

1. A test guard circuit for interrupting a flow of current through a pair of lines, wherein one of the pair of lines extends between a line input and a line output and the other line extends between a neutral input and a neutral output, the test guard circuit comprising:
    a ground fault circuit interrupter (GFCI) wherein the GFCI comprises:
        a first switch having a first input terminal and a first contact terminal;
        a second switch having a second input terminal and a second contact terminal, wherein the first switch is ganged to the second switch;
        a relay circuit for controlling the first and second switches, wherein each of the switches comprises a first non-energized position and a second energized position and wherein the first switch is connected between the line input and the line output and the second switch is connected between the neural input and the neutral output;
        a fault detection circuit for detecting a ground fault in the pair of lines, and wherein the relay circuit comprises a solenoid;
        a first bi-stable electronic latch circuit for deenergizing the relay circuit when a fault is detected;
    a monitoring module integrated with the GFCI, the monitoring module comprising:
        a simulated ground fault generator for generating a ground fault on pulse for testing the fault detection circuit and the first bi-stable electronic latch circuit;
        a relay synchronized switch for disabling current to the relay circuit during the ground fault on pulse;
        an auto-monitoring logic module for monitoring the first bi-stable electronic latch circuit during the ground fault on pulse;
        an end-of-life switch for disabling the relay circuit if the auto-monitoring logic module determines the first bi-stable electronic latch circuit has failed; and
    wherein the GFCI further comprises:
        a power supply circuit for providing current to the relay synchronized switch, and wherein the relay synchronized switch provides current to the fault detection circuit via the solenoid.

2. The test guard circuit as in claim 1 wherein the fault detection circuit comprises:
    a sense transformer;
    a grounded neutral transformer; and
    a GFCI Integrated Circuit (IC) coupled to the sense transformer and the grounded neutral transformer.

3. The test guard circuit as in claim 2 wherein the auto-monitoring logic module comprises a predetermined number of failures of the GFCI circuit in response to the simulated ground fault on pulse to test the GFCI circuit, wherein the tested GFCI circuit comprises:
    the sense transformer;
    the grounded neutral transformer;
    the GFCI Integrated Circuit (IC) coupled to the sense transformer and the grounded neutral transformer; and
    first bi-stable electronic latch circuit.

4. The test guard circuit as in claim 1 wherein the first bi-stable electronic latch circuit comprises an NPN transistor.

5. The test guard circuit as in claim 1 wherein the solenoid comprises a magnetic field when energized by the current provided by the relay synchronized switch and a collapsing magnetic field when the current is interrupted by the relay synchronized switch and wherein the collapsing magnetic field provides current through the solenoid and the fault detection circuit during the ground fault on pulse.

6. A ground fault circuit interrupter circuit for interrupting a flow of current through a pair of lines, wherein one of the pair of lines extends between a line input and a line output and the other line extends between a neutral input and a neutral output, the GFCI circuit comprising:
    a fault detection circuit for detecting a ground fault in the pair of lines;
    a relay circuit comprising a solenoid for controlling the first and second switches, wherein each of the switches comprises a first non-energized position and a second energized position and wherein the first switch is connected between the line input and the line output and the second switch is connected between the neural input and the neutral output;
    a first bi-stable electronic latch circuit for deenergizing the relay circuit when a fault is detected by the fault detection circuit;
    a monitoring module integrated with the GFCI, the monitoring module comprising:
        a simulated ground fault generator for generating a ground fault on pulse for testing fault detection circuit components;
        a relay synchronized switch for providing current to the fault detection circuit through the relay circuit, and wherein the relay synchronized switch turns off the fault detection circuit by interrupting current to the fault detection circuit and the relay circuit; and wherein the relay circuit maintains the second energized position and provides operating current to the fault detection circuit for the duration of the ground fault on pulse.

7. The GFCI circuit as in claim 6 further comprising:
an auto-monitoring logic module for monitoring the first bi-stable electronic latch circuit during the ground fault on pulse;
an end-of-life switch for disabling the relay circuit if the auto-monitoring logic module determines the first bi-stable electronic latch circuit has failed; and
a power supply circuit for providing current to the relay synchronized switch.

8. The GFCI circuit as in claim 6 wherein the tested fault detection circuit components comprise:
a sense transformer;
a grounded neutral transformer;
a GFCI Integrated Circuit (IC) coupled to the sense transformer and the grounded neutral transformer; and
the first bi-stable electronic latch circuit.

9. A method for intermittently testing components of a ground fault circuit interrupter (GFCI) for interrupting power between a line input and a line output, the method comprising:
providing a simulated ground fault generator for generating a ground fault test on pulse;
providing a relay for controlling switches for interrupting power between the line input and the line output when the relay is deenergized;
providing a relay synchronized switch for interrupting current to the relay for the duration of the ground fault test on pulse;
switching on a first bi-stable electronic latch circuit during the ground fault test on pulse;
providing a monitoring circuit for detecting switch-on failure of the first bi-stable electronic latch circuit during the ground fault test on pulse; and maintaining the relay in an energized state for the duration of the ground fault test on pulse.

10. The method as in claim 9 further comprises providing an end-of-life switch for deenergizing the relay if the monitoring circuit determines the first bi-stable electronic latch circuit has failed.

11. A manually switched test guard circuit for interrupting a flow of current through a pair of lines, wherein one of the pair of lines extends between a line input and a line output and the other line extends between a neutral input and a neutral output, the test guard circuit comprising:
a ground fault circuit interrupter (GFCI) wherein the GFCI comprises:
a manually switched first switch having a first input terminal and a first contact terminal;
a manually switched second switch having a second input terminal and a second contact terminal, wherein the manually switched first switch is ganged to the manually switched second switch;

a relay circuit connected to the manually switched first and second switches, wherein each of the manually switched switches comprises a connected position and a disconnected position and wherein the manually switched first switch is connected between the line input and the line output and the manually switched second switch is connected between the neural input and the neutral output;
a fault detection circuit for detecting a ground fault in the pair of lines, and wherein the relay circuit comprises a solenoid;
a first bi-stable electronic latch circuit for deenergizing the relay circuit when a fault is detected;
a monitoring module integrated with the GFCI, the monitoring module comprising:
a simulated ground fault generator for generating a ground fault on pulse for testing the fault detection circuit and the first bi-stable electronic latch circuit;
a relay synchronized switch for disabling current to the relay circuit during the ground fault on pulse;
an auto-monitoring logic module for monitoring the first bi-stable electronic latch circuit during the ground fault on pulse;
an end-of-life switch for disabling the relay circuit if the auto-monitoring logic module determines the first bi-stable electronic latch circuit has failed;
wherein the GFCI further comprises:
a power supply circuit for providing current to the relay synchronized switch, and wherein the relay synchronized switch provides current to the fault detection circuit via the solenoid and wherein the current maintains the manually switched switches in the connected position; and
wherein the solenoid comprises a magnetic field when energized by the current provided by the relay synchronized switch and a collapsing magnetic field when the current is interrupted by the relay synchronized switch and wherein the collapsing magnetic field provides current through the solenoid to maintain the manually switched switches in the connected position during the ground fault on pulse.

12. The manually switched test guard circuit as in claim 11 wherein the fault detection circuit comprises:
a sense transformer;
a grounded neutral transformer; and
a GFCI Integrated Circuit (IC) coupled to the sense transformer and the grounded neutral transformer.

13. The manually switched test guard circuit as in claim 12 wherein the auto-monitoring logic module comprises a predetermined number of failures of the GFCI circuit in response to the simulated ground fault on pulse to test the GFCI circuit, wherein the tested GFCI circuit comprises:
the sense transformer;
the grounded neutral transformer;
the GFCI Integrated Circuit (IC) coupled to the sense transformer and the grounded neutral transformer; and the
first bi-stable electronic latch circuit.

\* \* \* \* \*